(12) United States Patent
Kirchner et al.

(10) Patent No.: US 10,367,329 B2
(45) Date of Patent: Jul. 30, 2019

(54) DIRECT DIODE PUMPED TI:SAPPHIRE LASERS AND AMPLIFIERS

(71) Applicant: KM Labs Inc., Boulder, CO (US)

(72) Inventors: Matthew S. Kirchner, Westminster, CO (US); Sterling Backus, Erie, CO (US)

(73) Assignee: KM Labs Inc., Boulder, CO (US)

(*) Notice: Subject to any disclaimer, the term of this patent is extended or adjusted under 35 U.S.C. 154(b) by 0 days.

(21) Appl. No.: 15/847,872

(22) Filed: Dec. 19, 2017

(65) Prior Publication Data

US 2018/0226766 A1 Aug. 9, 2018

Related U.S. Application Data

(60) Provisional application No. 62/436,092, filed on Dec. 19, 2016.

(51) Int. Cl.
*H01S 3/02* (2006.01)
*H01S 3/04* (2006.01)
*H01S 3/08* (2006.01)
*H01S 3/10* (2006.01)
*H01S 3/11* (2006.01)
*H01S 3/16* (2006.01)
*H01S 3/23* (2006.01)
(Continued)

(52) U.S. Cl.
CPC .......... *H01S 3/1625* (2013.01); *H01S 3/0407* (2013.01); *H01S 3/0941* (2013.01); *H01S 3/09415* (2013.01); *H01S 3/10007* (2013.01); *H01S 3/10061* (2013.01); *H01S 3/1106* (2013.01); *H01S 3/235* (2013.01); *H01S 3/2308* (2013.01); *H01S 5/02284* (2013.01); *H01S 5/4012* (2013.01); *H01S 5/4025* (2013.01); *H01S 3/025* (2013.01); *H01S 3/042* (2013.01); *H01S 3/0813* (2013.01); *H01S 3/08072* (2013.01); *H01S 3/09408* (2013.01); *H01S 3/094084* (2013.01); *H01S 3/1028* (2013.01); *H01S 3/1636* (2013.01); *H01S 5/32341* (2013.01)

(58) Field of Classification Search
CPC .... H01S 3/1653; H01S 3/1633; H01S 3/1028; H01S 3/23; H01S 3/094
USPC ........................................... 372/41
See application file for complete search history.

(56) References Cited

U.S. PATENT DOCUMENTS

2011/0170566 A1* 7/2011 Holtom ............... H01S 3/09415
372/18
2011/0249321 A1* 10/2011 Savage-Leuchs ..........................
G02B 6/02009
359/341.3

(Continued)

OTHER PUBLICATIONS

Direct diode-pumped Kerr-lens mode-locked Ti:sapphire laser, Durfee et al., Jun. 18, 2012 / vol. 20, No. 13 / Optics Express 13677.
Spectroscopic and laser characteristics of Ti:Al 2 0 3, Moulton, vol. 3, No. 1/Jan. 1986/J. Opt. Soc. Am. B.
Multipass Ti:sapphire amplifier based on a parabolic mirror, Yang et al., Optics Communications 234 (2004) 385-390.

(Continued)

*Primary Examiner* — Tuan N Nguyen
(74) *Attorney, Agent, or Firm* — Macheledt Bales LLP; Jennifer L. Bales

(57) ABSTRACT

Direct diode-pumped Ti:sapphire laser amplifiers use fiber-coupled laser diodes as pump beam sources. The pump beam may be polarized or non-polarized. Light at wavelengths below 527 nm may be used in cryogenic configurations. Multiple diode outputs may be polarization or spectrally combined.

18 Claims, 4 Drawing Sheets

(51) Int. Cl.
  *H01S 3/042*   (2006.01)
  *H01S 3/081*   (2006.01)
  *H01S 3/094*   (2006.01)
  *H01S 3/102*   (2006.01)
  *H01S 5/40*    (2006.01)
  *H01S 3/0941*  (2006.01)
  *H01S 5/022*   (2006.01)
  *H01S 5/323*   (2006.01)

(56) References Cited

U.S. PATENT DOCUMENTS

2012/0250719 A1* 10/2012 Hodgson .............. H01S 3/042
                                              372/70
2014/0064305 A1*  3/2014 Sipes, Jr. ........... G02B 19/0057
                                              372/6
2014/0219297 A1*  8/2014 Backus .............. H01S 3/08018
                                              372/18

OTHER PUBLICATIONS

Tunable Solid-state Lasers, Moulton, IEEE vol. 80, No. 3, Mar. 1992.
Thin-disk laser pump schemes for large number of passes and moderate pump source quality, Schuhmann et al., vol. 54, No. 32 / Nov. 10, 2015 / Applied Optics.
Highly Efficient Multiple Exciton Generation in Colloidal PbSe and PbS Quantum Dots, Ellingson et al., Nano Letters 2005, vol. 5, No. 5, 865-871.
Direct diode-pumped Kerr Lens 13 fs Ti:sapphire ultrafast oscillator using a single blue laser diode, Backus et al., vol. 25, No. 11 | May 29, 2017 | Optics Express 12469.
Tm-Doped Fiber Lasers: Fundamentals and Power Scaling, Moulton et al., IEEE Journal of Selected Topics in Quantum Electronics, vol. 15, No. 1, Jan./Feb. 2009.
Diode-pumped thin-disk Yb:YAG regenerative amplifier, Honninger et al., Appl. Phys. B 65, 423-426 (1997).

* cited by examiner

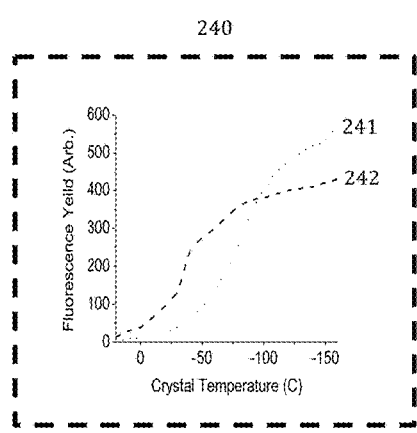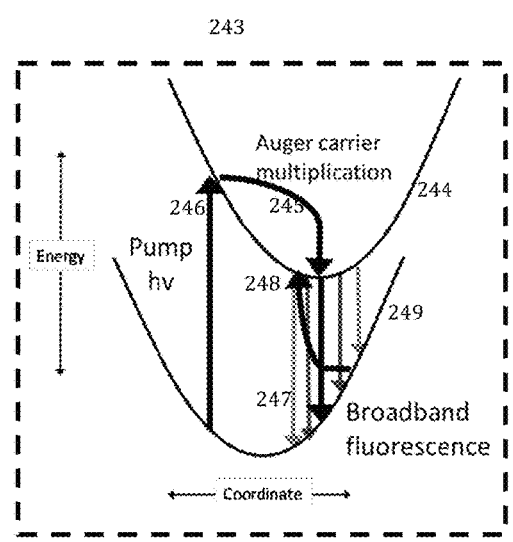
Figure 5A                    Figure 5B

DIRECT DIODE PUMPED TI:SAPPHIRE LASERS AND AMPLIFIERS

This invention was made with government support under grant number DE-SC0009707 awarded by the Department of Energy. The government has certain rights in the invention.

BACKGROUND OF THE INVENTION

Field of the Invention

The present invention relates to using laser diodes to directly pump Ti:sapphire laser material for amplification of ultrafast pulses.

Discussion of Related Art

Many scientific and industrial applications can benefit from the use of ultrashort sub-100 fs duration pulses with moderate energy but at >100 kHz repetition rates. Typically, Ti:sapphire oscillator/amplifier systems have filled this role as a workhorse for research applications, with their unmatched ultrashort-pulse amplification performance and tunability. More recently, Yb-based fiber lasers and other ultrafast sources have become more-broadly adopted for less-demanding applications, offering the advantages of a direct diode-pumped architecture (i.e. light from a laser diode is used to energize the Yb material that generates and amplifies the ultrashort pulses) at the expense of pulse duration performance. In contrast, Ti:sapphire systems require complex intracavity-doubled green lasers for the pump source. Nonlinear pulse compression or parametric amplification pumped by Yb-based lasers can satisfy some needs for shorter pulses and tunability, but again this increases complexity and reduces the reliability of the source, and often generates pulses with large pedestal and other poor characteristics. Thus, the ideal ultrafast laser—diode-pumped, simple, reliable, and with uncompromising performance—remains to be realized. This work demonstrates a Ti:sapphire laser system that is scalable, robust, and high performance that combines the advantages of the Ti:sapphire gain medium with the advantages of direct diode pumping that has previously only been demonstrated in other less-ideal gain media.

Some useful background for the present invention is provided in the following sources. Backus, S., et al., Direct diode pumped Ti:sapphire ultrafast regenerative amplifier system. Optics Express, 2017. 25(4): p. 3666-3674. Moulton, P. F., Spectroscopic and laser characteristics of Ti:Al2O3. Journal of the Optical Society of America B, 1986. 3(1): p. 125-33. Durfee, C. G., et al., Direct diode-pumped Kerr-lens mode-locked Ti:sapphire laser. Optics Express, 2012. 20(13): p. 13677-13683. Moulton, P., Tunable Solid State Lasers. Proceedings of the IEEE, 1992. 80(3): p. 348. Ellingson, R. J., et al., Highly efficient multiple exciton generation in colloidal PbSe and PbS quantum dots. Nano Letters, 2005. 5(5): p. 865-871. Moulton, P. F., et al., Tm-Doped Fiber Lasers: Fundamentals and Power Scaling. IEEE Journal of Selected Topics in Quantum Electronics, 2009. 15(1): p. 85-92. Schuhmann, K., et al., Thin-disk laser pump schemes for large number of passes and moderate pump source quality. Applied Optics, 2015. 54(32): p. 9400-9408. Honninger, C., et al., Diode-pumped thin-disk Yb:YAG regenerative amplifier. Applied Physics B-Lasers And Optics, 1997. 65(3): p. 423-426. Yang, S. Y., et al., Multipass Ti: sapphire amplifier based on a parabolic mirror. Optics Communications, 2004. 234(1-6): p. 385-390.

SUMMARY

We successfully demonstrated the first direct diode-pumped ultrafast Ti:sapphire laser amplifier. Furthermore, the current availability of high-power 445-465 nm laser diodes and fiber-coupled modules is advancing very rapidly, and now represents a reliable and cost-effective solution. Through novel design of the pumping geometry, we demonstrated for the first time reliable pumping of Ti:sapphire with a non-polarized pump laser source, and the first (to our knowledge) use of fiber-coupled pump light to implement a Ti:sapphire laser and amplifier. This is important in that a major advantage for continuous operation is the positional stability of the pump light source in an ultrafast laser amplifier. The aggregate net result from this project is a very substantial advance in state of the art for ultrafast laser technology, with considerable promise for applications. The main invention is the use of light directly from diode lasers, either unpolarized or polarized and delivered either using discrete optics or optical fibers, for the pumping of Ti:sapphire lasers. We additionally disclose an enhancement in gain and overall conversion efficiency achieved through pumping Ti:sapphire amplifiers with light at wavelengths shorter than 527 nm while the laser crystal is maintained at low temperature, well below ambient and in some cases at cryogenic temperature.

A regenerative or multipass Ti:sapphire amplifier is pumped with direct diode light comprising single or multiple emitters. It may be cryo cooled and/or pumped substantially below the peak absorption wavelength. It may include pulsed diode operation, and free space spatial and/or spectral combination of diodes as the pump source. It may include Fiber coupled combination of diodes as the pump source.

One example is a Ti:sapphire amplifier with two separately-pumped gain regions spatially separated in the amplifier crystal. An embodiment is a Ti:sapphire amplifier in a thick disk geometry that is directly diode pumped and the pump light is recycled to pass multiple times through the same spot on the crystal.

A specific embodiment comprises a system for amplification of ultrafast laser pulses, including a seed source of light containing spectral components within the Ti:sapphire gain bandwidth of 600-1080 nm, a Ti:sapphire crystal as the gain medium, and a diode pump beam comprising one or more diode lasers emitting within the Ti:sapphire absorption bandwidth of ~400-600 nm, where the diode pump beam is directed into the Ti:sapphire crystal creating a population inversion, and the seed source is passed one or more times through the population inversion region of the Ti:sapphire crystal to effect gain.

In some cases the Ti:sapphire crystal is cooled to below 200 K. The diode pump beam is comprised of the output from multiple diodes coupled into a multimode fiber optic cable with a numerical aperture below 0.22. the diode pump beam may comprise the output from multiple diodes coupled into a multimode fiber optic cable with a numerical aperture below 0.22 and a fiber core diameter below 230 microns. Or, the diode pump beam could comprise the output from multiple diodes coupled into a multimode fiber optic cable with a numerical aperture below 0.40 and a fiber core diameter below 105 microns.

The diode pump beam may consist of wavelengths between 435 and 480 nm. It may use polarization or spectral combining of multiple pump diodes, or both.

The seed source might be a mode-locked Ti:sapphire oscillator, possibly directly-diode pumped. A regenerative cavity can be placed around the Ti:sapphire gain medium. Or, a multipass amplifier configuration could be placed around the Ti:sapphire gain medium. A combination of diode laser sources and non-direct-diode laser sources can be used to pump the Ti:sapphire crystal gain medium for enhanced gain.

In some embodiments the crystal is thinner than the confocal parameter of the pump light, and the pump light is re-imaged onto the crystal one or more times to absorb a significant fraction of the pump light. A reflective geometry similar to the thin disk can be used, with one end of the crystal coated to reflect both the laser and the pump light, and with an optical setup allowing for multiple passes of the pump.

The pump light might be low brightness from a fiber, or multiple pump diodes.

In a useful embodiment, the Ti:sapphire crystal gain medium is cooled to below 200 K and is pumped by a diode laser source with wavelength below 480 nm, providing enhanced efficiency amplification of >1 excited states per absorbed short-wavelength photon.

A Ti:sapphire amplification system has the pump light contained within a beam with high numerical aperture (NA>0.2) and is coupled into a crystal with a path length between 0.5-1.5 absorption lengths, with crystal doping at or below 0.25% Ti by weight, with a seed mode size 0.8-1.6 times the pump spot size in the crystal, such that the amplification is substantially optimized. The pump light is provided by one or more diode lasers coupled into a multimode optical fiber, for example with a numerical aperture below 0.22.

An amplification system embodiment for utilizing multiple pump laser sources contains a seed laser source, a laser crystal gain medium and one or more pump laser sources. The pump laser light from the one or more sources is focused to more than one region in the laser crystal gain medium and the seed laser source is passed through the multiple pumped regions, enhancing the gain achievable from a single crystal. A useful embodiment has the laser crystal gain medium as Ti:sapphire cooled below 200 K, and the seed laser source provides ultrafast laser light. The seed laser source could be a modelocked Ti:sapphire oscillator, possibly directly-diode pumped.

The pump laser light could be provided by fiber-coupled diode lasers. One pump laser source is passed through the crystal and then reimaged into a spatially separated spot within the same crystal. The seed light is passed through the multiple pumped regions by a regenerative amplifier cavity configured to overlap with all of the pumped regions, or by a multipass amplifier cavity configured to overlap with all of the pumped regions. The laser crystal gain medium might consist of two or more separate gain crystals mounted in the same mechanical mount.

Another amplification system embodiment consists of a seed source of laser light containing spectral components within the Ti:sapphire gain bandwidth of 600-1080 nm, a Ti:sapphire crystal gain medium that is substantially less than one absorption length thick, mounted to a heat extracting element and providing reflection of pump and seed light on the back surface, and a diode pump beam comprising one or more diode lasers emitting within the Ti:sapphire absorption bandwidth of 400-600 nm. The diode pump beam is directed into the Ti:sapphire crystal multiple times by pump beam imaging optics, creating a population inversion and the seed source is passed one or more times through the population inversion region of the thin Ti:sapphire crystal to effect gain. Again, the Ti:sapphire gain crystal may be cooled below 200 K

BRIEF DESCRIPTION OF THE DRAWINGS

FIG. 2A illustrates pump sources coupled through a combination of lenses. FIG. 2B illustrates pump sources spectrally or spatially combined and then coupled through a combination of lenses. FIG. 2C illustrates pump sources coupled through a combination of lenses into the different gain volumes.

FIG. 4A shows single emitter laser diode elements collimated and focused with lenses. FIG. 4B shows a fast axis view of the image plane from the three emitter combination stage being relay imaged by lenses. FIG. 4C shows a slow axis view of the image plane from the three emitter combination stage being relay imaged by lenses.

FIG. 5A is a plot showing the fluorescence yield from green blue light as temperature is varied. FIG. 5B is an energy diagram for the Auger process that leads to an enhanced efficiency for below peak absorption wavelength pumping of Ti:sapphire.

DETAILED DESCRIPTION OF THE INVENTION

Figure 1:
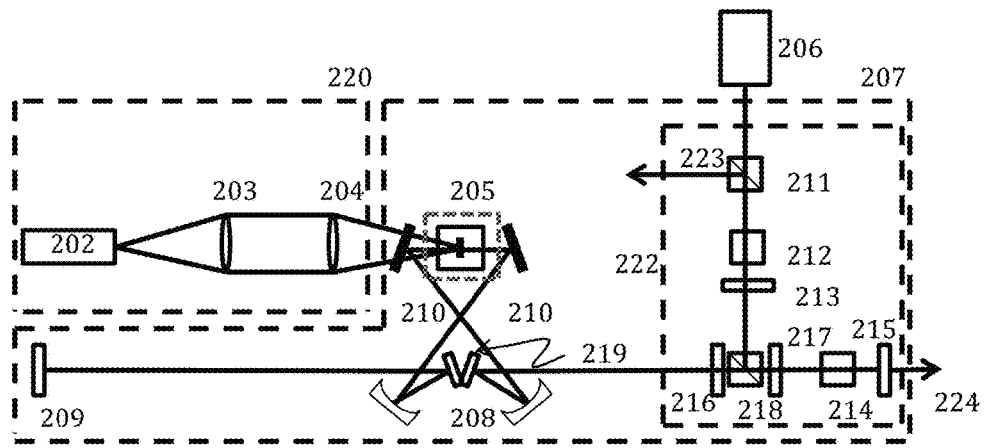
FIG. 1 is a schematic block diagram illustrating one configuration of direct-diode laser pumping of a Ti:sapphire laser or pulse amplifier according to the present invention.

FIG. 1 is a schematic block diagram illustrating one configuration of direct-diode laser pumping of a Ti:sapphire laser or pulse amplifier. Pump beam source 220 from a diode laser source 202 is coupled in to a Ti:sapphire gain medium 205 using lenses 203, 204. A regenerative amplifier cavity 207 is constructed around the Ti:sapphire gain medium with mirrors 208, 209, 210, 215, polarizers 211, 218, waveplates 213, 217, 216, and a pockels cell 214, with the regenerative amplifier parts outlined in box 222. An input ultrafast source 206 provides seed light that is switched into the cavity for a number of round trips by the pockels cell until it is switched out. A faraday rotator 212 causes the amplified light 223 to exit the output port of the input polarizer 211

Figure 2A:
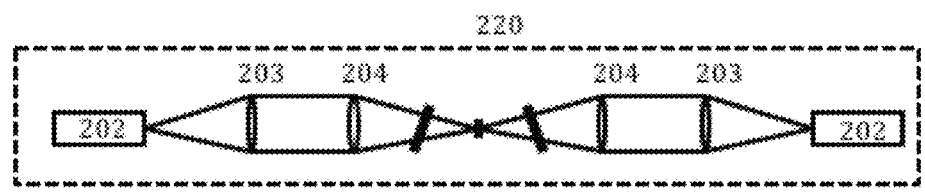
FIGS. 2A, 2B and 2C illustrate different fiber coupled pumping schemes for direct diode pumping.
Figure 2B:
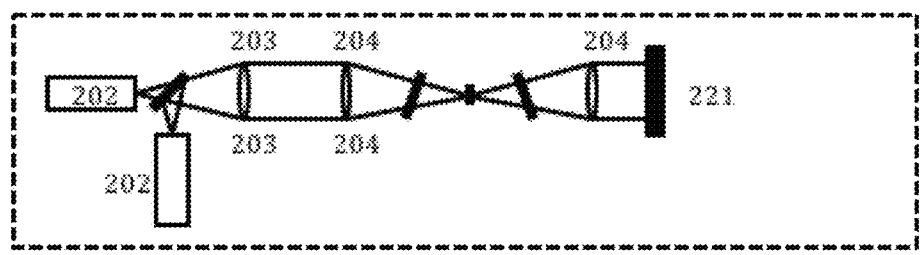
Figure 2C:
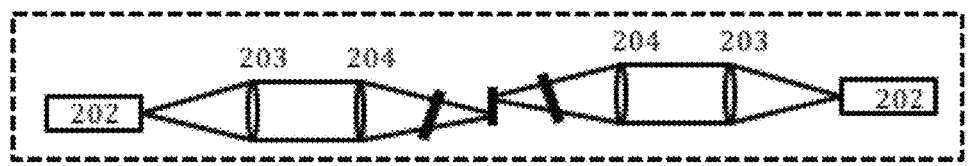

FIGS. 2A, 2B, and 2C show different fiber coupled pumping schemes for direct diode pumping. FIG. 2A: Pump sources 202 can be coupled through a combination of lenses 203, 204 into the same gain volume within the Ti:sapphire crystal 205. FIG. 2B: Pump sources 202 can be spectrally or spatially combined and coupled through a combination of lenses 203, 204 into the same gain volume within the Ti:sapphire crystal. The light can also be retroreflected with a mirror to improve efficiency 221. FIG. 2C: Pump diode lasers 202 can be coupled through a combination of lenses 203, 204 into the different gain volumes within the Ti:sapphire crystal, each creating a population inversion that can be extracted as pulse amplification by the amplifier cavity.

FIG. 6 is a diagram of the details of a laser source 202 having a fiber interface. 201 is a spatially coupled laser diode module, 199 is a multimode fiber, and 200 is a fiber collimator. Diode laser 202 has a fiber output of the diode light, but lenses 203, 204 are still used to focus the fiber-outputted diode light into the crystal 205.

Figures 3A, 3B:
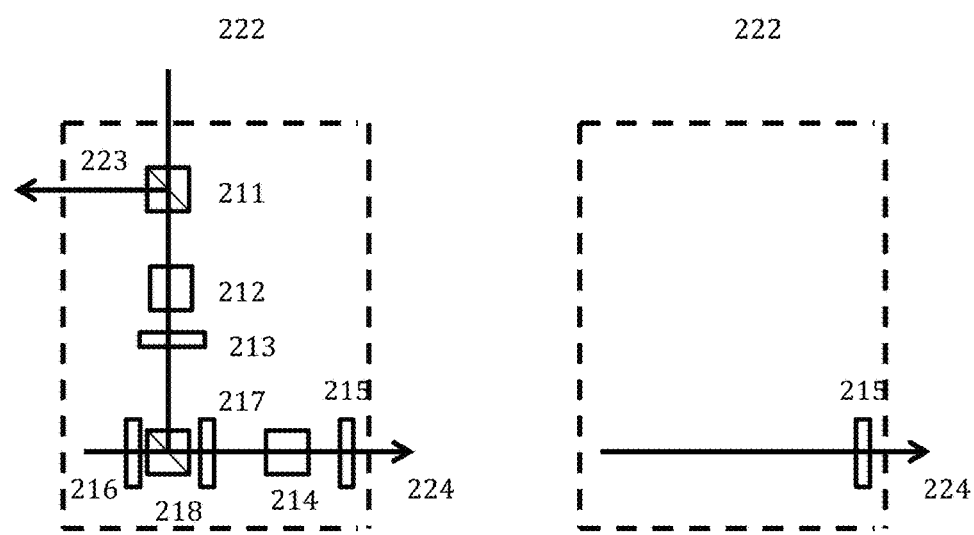
FIG. 3A is a schematic detailed drawing for the pulsed amplifier configuration described in FIG. 1.
FIG. 3B shows an alternate configuration where the regenerative amplifier portions of the cavity have been replaced by an output coupler to generate a CW laser output beam.

FIG. 3A: Schematic detail for the pulsed amplifier configuration described in FIG. 1. FIG. 3B: Alternate configuration for block 222 where the regenerative amplifier portions of the cavity have been replaced by an output coupler 215 to generate a CW laser output beam 224.

Figure 4A:
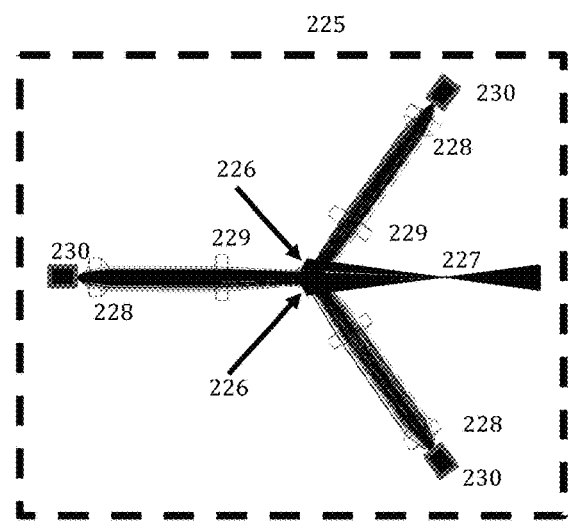
FIGS. 4A-C illustrate a spatial combination scheme for three single emitters.
Figure 4B:
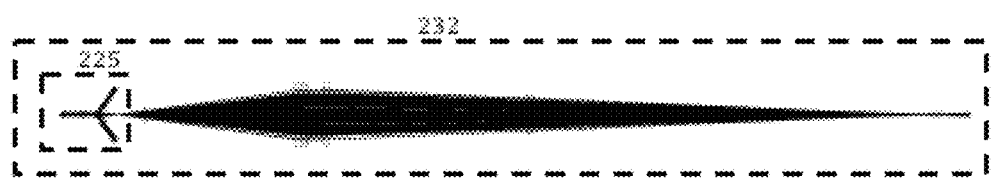
Figure 4C:
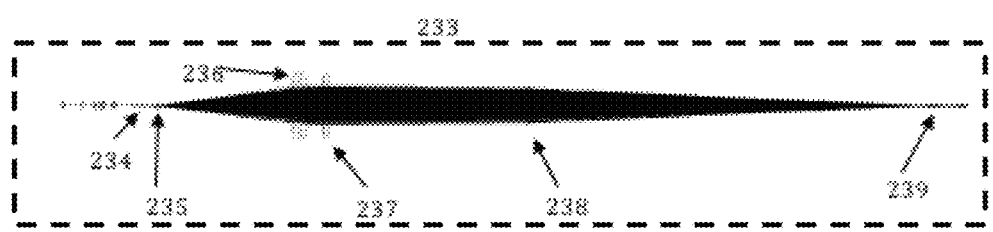

FIGS. 4A-4C shows a spatial combination scheme for three single emitters. FIG. 4A: Single emitter laser diode elements 230 are collimated and focused with lenses 228 and 229. The three beams are spatially combined by mirrors 226 and overlapped to the image plane 227. FIG. 4B: Fast axis view of the image plane from the three emitter combination stage 225 being relay imaged by lenses 234-238 and generate a high brightness extended focal volume 239 within a Ti:sapphire gain medium 205. FIG. 4C: Slow axis view of the image plane from the three emitter combination stage 225 being relay imaged by lenses 234-238 and generate a high brightness extended focal volume 239 within a Ti:sapphire gain medium 205.

FIG. 5A is a graph 240 of the fluorescence yield from 10 W of green 532 nm light 242 and 10 W of blue 445 nm light 241 pumping the same mode volume of a Ti:sapphire crystal as temperature is varied from 20 degrees C. to −160 degrees C. The fluorescence yield for the green pumping 242 follows the typical behavior described before, while the fluorescent yield for blue pumping 241 displays enhanced efficiency below approximately −90 degrees C. This points to the potential for an efficiency-enhancing Auger process. FIG. 5B is an energy diagram 243 for the Auger process that leads to an enhanced efficiency for below peak absorption wavelength pumping of Ti:sapphire. A high energy pump photon 246 provides enough energy for long-wave fluorescence populated states high in the ground state vibrational band 249 to can interact with electrons injected high into the excited state band by the pump laser 245 to create two excited-state electrons that can fluoresce 247, 248.

The successful demonstration of this invention required addressing a significant number of challenges—it is not simply a case of swapping one pump source for another. The major parts to this invention are:

Combining high power single emitters into a single pump beam.
Maintaining pump laser brightness in a free-space or fiber-coupled configuration.
Geometry issues when pumping with high NA beams combined into a crystal kept in a cryostat.
Development of a low-loss cavity to function effectively with the relatively low gain.
Thermal management.
CW pumping of a gain medium with relatively short~few μsec lifetime.
Addressing the lower quantum efficiency of 450 nm compared with 532 nm.

We addressed all these major challenges in this invention.

Pump Beam Brightness

The absorption cross section for pumping of Ti:sapphire 205 peaks at ~490 nm. The absorption cross section is polarization dependent, and is considerably below its peak value at 450 nm. This increases the brightness requirement for 450 nm pumping over that required for green pumping since the doping density for Titanium in sapphire is limited to approximately 0.25% whilst maintaining the figure of merit of the material (ratio of absorption at the pump wavelength to absorption at the laser wavelength, which is ideally as high as possible). Thus, one might expect that with the recent availability of ~1 W single emitter 520 nm diodes, this wavelength would be preferable for pumping. However, we found that the broad spectral bandwidth of the 520 nm diodes makes wavelength combination of the diodes difficult, and single emitters are not available above 1 W average power. These two effects limit the ability to combine multiple laser diode sources to increase the available pump power. Thus, the amplifier work to-date uses ~440-465 nm diodes 202. In this region, the intrinsic linewidth of individual lasers is narrow enough to use wavelength in addition to spatial combination to combine many sources 230, each of which can have power of several watts. This enables the combined source 225 to achieve spatial brightness sufficient for achieving gain in an amplification platform.

In our past work in direct diode-pumped Ti:sapphire modelocked lasers, the modelocking mechanism relied on a very tight focus of the pump light—in that work, we demonstrated that a diffraction limited focus in one dimension of the pump spot was sufficient to implement stable Kerr-lens modelocking. However, for a laser-amplifier system, the objective is high average power. This will necessarily require a much higher pump power, originating from many single emitter diodes 202. This can be made practical and repeatable by coupling the light into an optical fiber. Although a fiber-coupled pump has many distinct advantages (stability of pump mode size, shape, and position, as well as easy pump laser replacement), it also presents many challenges—scrambling of the pump polarization and reduced overall spatial brightness even as the total power is increased. For this reason, other geometrical and spectral beam combination methods can be used to combine multiple emitters with only small reductions in spatial brightness over a single emitter while maintaining polarization. Both fiber coupled and free space pump sources can be used to directly diode pump Ti:sapphire.

Fortunately, many of these challenges have already been addressed in the development of high brightness fiber-coupled diodes in the infrared—work that has been progressing for decades to a high level of refinement. For the initial demonstrations, 10 W total output from a 400 μm core, 0.22 NA, did not provide sufficient brightness to demonstrate laser action. However, this exercise did provide significant insights into the challenges involved. A second iteration was then successful: using 50 W from a 200 μm core 0.22 NA fiber, the brightness from a single fiber was increased by 20×. This brightness was sufficient drive CW gain very competitive with that of current CW-pumped Ti:sapphire lasers, and sufficient to exceed the gain threshold even for a regenerative amplifier with nearly 10% cavity loss. Future fiber-coupled laser diode sources expect to deliver to us a >75 W module, with up to a 2× increase in brightness over our currently-used sources. Several other companies are rapidly increasing the average power and spatial brightness and first demonstrations of 150 W in a 200 μm, 0.22 NA fiber have been accomplished. Such sources are well-positioned to utilized the methods disclosed here for the direct diode pumping of Ti:sapphire.

In addition to fiber coupling, multiple single emitters 230 can be spatially and spectrally combined as shown in FIG. 4A. Three single emitters 230 are spatially combined and imaged to an intermediate plane 227 where the low M^2 fast axis is used as the dimension for spatial combination. The imaged and overlapped beams are essentially angularly multiplexed in this geometry. Reimaging with differential magnification in the fast and slow axis can then create an extended high brightness focal volume 239 within the Ti:sapphire gain medium 205 with a high percentage of the absorbed light within a radius of 50 microns from the propagation axis. This configuration, combined with single emitters of >3 W of power, gives achievable gains of 2× per pass; ideal for a regenerative amplifier configuration.

Cavity Geometry and Operation

One of the biggest challenges with direct diode pumping of Ti:sapphire is the delivery of the pump light to the amplifier crystal so that it generates a gain volume with sufficient population inversion and mode overlap with the regenerative or multipass amplification beam path. Along with this issue is the mitigation of thermal issues from the high average power being delivered to the Ti:sapphire gain medium. With a total pump power of 100 W from 2×50 W pump modules, it was clear from the beginning that any successful ultrafast laser-amplifier system would benefit from the use of cryogenic cooling simply to manage thermal lensing in the system—in general, Ti:sapphire lasers running at room temperature exhibit focal spot temperature gradients that create a very strong thermal lens. In CW lasers, this is ameliorated by a very tight, focused laser mode in the Ti:sapphire crystal where the effect of the large thermal lens is ameliorated. However, the tight focusing approach was not feasible with high power pumping and low spatial brightness sources, so for some embodiments we implemented cryogenic cooling.

The very large NA of the pump light from the fiber-coupled diode 202 required a very compact vacuum cryostat with windows as close as practical to the crystal. To overcome this challenge, we employed a new cryostat 198 with a much smaller cold head. See FIG. 7. Laser gain medium (e.g. Ti:sapphire crystal) 197 is disposed within cryostat 198, and both form the gain medium block 205. This allowed us to get the 100 mm focal length, 50 mm diameter achromatic lenses close enough to the crystal to 1:1 image the pump fiber tip onto the crystal. Although this cryo is based on a different coolant than the recirculating helium cryocoolers we typically employ, and operates at somewhat higher base temperature (−160 C=113K vs 50K), it was sufficient to reduce thermal lensing in the cavity where we could design a laser cavity to tolerate the expected thermal lens over a wide-enough operating range to make the cavity stable in practice. We additionally designed the regenerative amplifier cavity to be tolerant to the thermal lens expected in high pump power operation.

In developing this cryocell, we quickly made a remarkable and unexpected observation. At room temperature and pumping with 50 W, we saw very little fluorescence compared to our experience with pumping at similar power levels with 532 nm. (FIG. 5A) However, there is a dramatic increase in the blue-pumped fluorescence when the crystal approaches −160 C. Work is ongoing to determine if this also corresponds to an increase in gain and overall laser efficiency compared to 532 nm pumping, as the high thermal lens distortion precluded lasing at room temperature, and thus a direct comparison of low- and room-temperature operation. However, generally an increase in fluorescence will correspond to a high branching ratio of pump light to the laser transition, or suppression of non-radiative decay pathways, both of which also will generally improve laser operation and efficiency.

Florescence Yield Studies Based on 532 nm and 450 nm Pumping Vs Temperature

To further investigate these large variations in fluorescence yield, we did studies directly comparing fluorescence vs temperature when pumped with a polarized 532 nm source of the same deposited power. FIGS. 5A and 5B show the resulting data. In both cases, we adjusted the power absorbed in the crystal to 10 W (200 um spot size in both cases), and used a spectrometer to observe the fluorescence intensity quantitatively. First—it is notable that although the 532 nm-pumped case shows visible fluorescence at all temperatures (unlike 450 nm pumping), the fluorescence intensity nevertheless varies quite significantly with temperature. This is consistent with previous measurements of the excited state lifetime of the Ti:sapphire that show temperature-dependent nonradiative decay competing with fluorescence. However, the character of the temperature dependence varies quite markedly for the two types of pump conditions. The 532 nm pump fluorescence yield saturates in a manner expected as nonradiative decay processes simply become insignificant at low temperatures. However, at 450 nm the yield continues to increase as temperature is decreased. Most markedly, the yield for the 450 nm pumping exceeds the 532 nm pumping for temperatures below ∼−85 C.

The fluorescence spectrum in all cases shows no marked shifts, making it likely that absorption in both cases populates the same excited-state manifold. However, Ti:sapphire is known to be an efficient laser, with a fluorescence yield of ∼1 at low temperatures. This means that the apparent fluorescence yield of Ti:sapphire may rise above 1 (to ∼1.5) when pumped with unpolarized blue light. These data are remarkable and represent a new possible mechanism advantageous for ultrashort-pulse amplification.

At first, the idea of an Auger-like excited state multiplication process (see FIG. 5B) seems unlikely—Ti:sapphire lases at wavelengths around 800 nm, so that in a simple energy level scheme it would seem impossible for a photon at 450 nm to create 2 excited-state carriers. However, the broad bandwidth of the Ti:sapphire gain spectrum would energetically allow this process—long-wave fluorescence populates states high in the ground state vibrational band, which then can interact with electrons injected high into the excited state band by the pump laser to create two excited-state electrons that can fluoresce. The intraband relaxation dynamics in Ti:sapphire are slow enough—gain quenching due to filling of the ground state is observed in Ti:sapphire for pulses shorter than ∼10 ps duration. Thus, in CW pumping, this Auger mechanism—similar in mechanism to what has been observed for carrier multiplication in proposed next-generation photovoltaics—is possible. Similar processes also occur for-example in the pumping of Tm:fiber lasers.

Diode-Pumped CW Ti:Sapphire Laser Demonstration

We tried several pumping schemes for maximizing absorption and volumetric brightness of the pump light into the Ti:sapphire to maximize single-pass gain. Owing to the high NA of the pump delivery system, feedback of pump light into the delivery fiber is a major issue. This tends to preclude, for example, simple pumping of the crystal simultaneously from both sides. However, we were successful reflecting the attenuated pump light back into the crystal for a second pass without damage to the pump diodes. Using a cavity with 40 cm ROC optics for focusing the pump mode into the crystal, and using a cavity set-up for maximum stability over a wide range of thermal lensing, we demonstrated CW lasing.

For operation with 100 W pump, we were not successful in obtaining overlap of pump spots from the individual pump modules in any configuration, due to the large NA of the pump and feedback sensitivity of the diodes. So we designed a cavity with two foci in the laser crystal to keep the two pump modules essentially independent. This configuration was successful in allowing us to test higher pump powers to verify our slope efficiency. Having two independent cavity foci enables the utilization of counter-propagating pump sources without having to overlap the pump sources in the same spot in the crystal, which can lead to optical feedback that can damage diode lasers. This configuration is a more compact than independently pumping two separate gain crystals, and offers a simple way to multiply the amount of available pump power. The utilization of this method at cryogenic temperatures helps to keep the thermal lens small enough that the multiple pump spots in the same crystal do not interact with each other thermally, which is essential for cavity stability and efficient amplification. As higher spatial brightness sources become available, it will also be possible to have additional pump spots and cavity spots in collimated space, reducing the complexity of the cavity design.

High Repetition Rate Pulse Amplification

By demonstrating laser action in a CW cavity (see FIG. 3B) with a relatively high-loss output coupler, we demonstrated the potential feasibility of implementing a pulse amplifier (see FIGS. 1, 3A). To this end, we inserted polarizers 211, 218, wave plates 213, 216, 217, and an EO Pockels cell 214 into the cavity. This cavity can be optimized in a q-switched mode of operation, which we demonstrated with 1 W output power.

The next step is to seed the amplifier with an ultrashort pulse. To demonstrate fully diode-pumped operation of a Ti:sapphire oscillator-amplifier system, in this work we used the modelocked Ti:sapphire oscillator pumped by 520 nm laser diodes described later, although the amplifier could be seeded by any suitable ultrafast seed source 206, such as a traditional oscillator pumped by a diode-pumped-solid-state (DPSS) green laser. This directly diode-pumped Ti:sapphire oscillator produces 40 mW at 68 MHz. The pulses pass through a polarizer 211, Faraday rotator (212)2/λ, and into the cavity through an intracavity polarizer 218. The regenerative cavity 207 contains the polarizer 218, a (e.g) half-wave plate 213, a quarter waveplate 217 and a KD*P pockels cell/driver 214. The pulses are trapped when the pockels cell 214 switches on, are held in the cavity for 162 round trips, and are then extracted back out through a Faraday rotator setup 212 to separate the injected pulse from the ejected, amplified pulse 223.

To conclude, we have demonstrated for the first time, using a combination of novel approaches, that the direct diode-pumping of Ti:sapphire for pulsed regenerative amplifiers. The demonstration shown in this work is also applicable to multipass amplifiers. The spatial and spectrally combined source described in FIG. 4 will allow for enough pump brightness to demonstrate a multipass amplifier in addition to a regenerative amplifier, which could enable pulses as short as 20 fs directly from the amplifier. Furthermore, we have discovered possible new physics in the Ti:sapphire system at low temperature when pumped by blue light, that may allow for especially high-efficiency operation.

Quasi CW Operation

To extend the utility of this invention beyond high repetition rate applications, we can turn to techniques like current pulsing of the diode emitters for enhanced peak power. By pulsing the pump laser diodes, it is possible to obtain higher brightness from the diodes at reduced duty cycle and thus repetition rate. To fully replace pulse frequency-doubled Nd lasers would require a total cumulative energy in the range of up to 50 mJ, delivered in a pulse duration comparable to the ~3 μsec excited state lifetime of Ti:sapphire. This corresponds to a transient power of ~15 kW, which is likely not yet practical. However, for operation at tens to one hundred kHz repetition rate, even a 3-4× increase in quasi-CW power from the diodes at a 15-25% duty cycle would be quite useful. For a practical system employing ~500 W CW power of 450 nm diodes (current cost~$250K), such a 2 kW quasi-CW power would correspond to ~6 mJ stored energy in the Ti:sapphire, allowing for ~1 mJ pulse output @ 100 kHz (100 W). This would be a very useful laser for high-order harmonic generation as well as for applications such as the photoinjectors for next-generation X-ray light sources.

It is well-known that pulsed operation of diode lasers can degrade their lifetime, depending on whether peak- or average-power from the diode is the lifetime-limiting factor. To our knowledge, no work has been done to-date to evaluate quasi-CW operation of GaN and other UV/Vis diodes. Given that current single emitters at 450 nm have a rated lifetime of 50,000 hrs (per Nichia), a reduction in lifetime of a factor of as much as 10×, might be acceptable for research lasers, and possibly also for industrial applications such as semiconductor metrology. Of course, in this case, diode replacement must be cost-effective, with easy replacement or redundancy. Once the prospects for quasi-CW operation are determined, the economics can be determined.

To investigate this issue, we did initial studies on quasi-CW operation of a single emitter 450 nm diode. Using a 1 W average power 450 nm diode (~3 uJ energy over the storage lifetime of Ti:sapphire), we demonstrated an increase of 3.5× the average power switching at 40 kHz (5 us on time, 10.5 μJ/pulse) without seeing any degradation over a short, 195 hr run. Thus, the initial evaluation of quasi-CW operation is promising. Implementation of quasi-CW pumping requires synchronization of the pumping with injection and extraction of seed pulses, and can reduce the cooling capacity required for the laser crystal.

Direct Diode Pumped Ti:Sapphire Oscillator Using 520 nm Diodes

Recently, industry has made advances in development of reliable high-power green laser diodes, with >1 W average power available in a single-emitter diode. This work is motivated by lighting applications. Since the absorption cross-section for Ti:sapphire at 520 nm is high, we investigated their use for Ti:sapphire pumping. Although, as mentioned previously, the properties of the 520 emitters do not lend themselves to high average power pumping of Ti:sapphire amplifiers, they are sufficient to demonstrate direct diode pumping of Kerr lens modelocked Ti:sapphire oscillators. We started by pumping a modelocked Ti:sapphire oscillator with 4×1 W single emitters, spectrally combined. These diodes exhibit relatively good beam quality—$M^2$~1.2 in the fast axis, and $M^2$~3 in the slow axis, like the 450 nm diodes. The big difference is in the spectral width of the 520 nm diodes, which is 4× larger. This makes spectral combining challenging. However, considering the central wavelength can be temperature tuned over a broader range, these diodes may be feasible for use with wavelength combining, either exclusively in this ~520 nm band, or in combination with diodes in other bands such as 405 nm, 450 nm, and 465 nm.

Alternate Approaches to Direct Diode-Pumped Ti:Sapphire Lasers

One of the major challenges for efficient operation of the direct diode-pumped Ti:sapphire lasers is in efficiently absorbing a very large-NA pump laser into a small lasing volume. Our success to-date conclusively demonstrates feasibility, and the slope-efficiency of 26% is surprisingly good for a relatively low spatial brightness simple pump beam focusing geometry where we know, based on the geometry, that much of the pump light is absorbed in regions of the crystal where the beam is poorly focused, and thus where this absorbed light does not contribute to gain or lasing.

The challenge of pumping solid state laser with low brightness diode lasers is not unique to Ti:sapphire, and can for-example be effectively addressed through the "thin-disk" pumping geometry. This approach, which has been used very successfully in other laser media such as Yb:YAG, places a relatively thin gain crystal at the focus of a parabola so that the pump beam can pass through the laser medium many times. In its simplest manifestation, the crystal is high-reflective coated on the back and anti-reflective coated on the front for the pump and lasing wavelengths. For pumping Yb:YAG, a typical number of double-passes for the diode pump is 16, and the optics can allow for as many as 50 double-passes. The crystal is bonded on the back to a heat sink, so that the heat load can be extracted primarily in the direction of the amplified beam 223, greatly reducing the effect of thermal lensing. Therefore, if, for example, the absorption depth for the pump light is 15 mm, the crystal thickness can be as thin as 150 μm and still efficiently absorb the pump light. This short crystal thickness makes it much more feasible to use fiber-coupled laser diode light with extremely large $M^2$ values, requiring a tight focusing with a short confocal parameter for the pump light.

When applied to Ti:sapphire, the considerations are somewhat different than for Yb:YAG. In the case of Yb:YAG or Yb:Glass, this thin medium allows for effective heat dissipation. However, sapphire is an excellent thermal conductor—better than copper at cryo temperatures. Thus previous investigations of thin-disk Ti:sapphire didn't observe a dramatic performance improvement in a thin-disk geometry. Relative to Yb:YAG, the longitudinal heat extraction aspect may not be as important, but the new feasibility of direct diode pumping merits a re-evaluation of the thin-disk geometry for a Ti:sapphire amplifier. For Ti:sapphire, since the medium has limited doping concentration, the primary advantage is to absorb the pump light in multiple passes in a laser crystal that is short enough to keep the pump light near focus, but too short to obtain full absorption of the pump in a single pass. The parabolic reflector geometry can allow, for example, for two diode pump modules to focus to the same spot, and multiple pump passes can allow very efficient energy deposition into a single gain region. Since the "thin" aspect of the Ti:sapphire crystal may be secondary, a "thick" disk pumping geometry, where the crystal is close to 1 mm thick, with parabolic pump focusing may also be applicable.

What is claimed is:

1. A system for amplification of ultrafast laser pulses, comprising:
   a seed source of seed light having spectral components within the Ti:sapphire gain bandwidth of 600-1080 nm;
   a gain medium comprising a Ti:sapphire crystal; and
   a diode pump beam source comprising a diode laser emitting within the Ti:sapphire absorption bandwidth of ~400-600 nm; and
   a cooling device for cooling the Ti:sapphire crystal to below 200 K;
   wherein the diode pump beam is directed into the Ti:sapphire crystal creating a population inversion; and
   wherein the seed source is passed through the population inversion region of the Ti:sapphire crystal to effect gain.

2. The system of claim 1 wherein the pump beam wavelength is below 480 nm, and wherein the system results in amplification of >1 excited states per absorbed short-wavelength photon.

3. The system of claim 1 wherein the diode pump beam source includes multiple diodes coupled into a multimode fiber optic cable with a numerical aperture below 0.22.

4. The system of claim 3 wherein the fiber optic cable has a fiber core diameter below 230 microns.

5. The system of claim 1 wherein the diode pump beam consists of wavelengths between 435 and 480 nm.

6. The system of claim 1 wherein the diode pump beam source further comprises multiple pump diodes and a polarization combining device for polarization combining beams from the multiple pump diodes.

7. The system of claim 1 wherein the diode pump beam source further comprises multiple pump diodes and a spectral combining device for spectrally combining beams from the multiple pump diodes.

8. The system of claim 1 wherein the seed source is a mode-locked Ti:sapphire oscillator.

9. The system of claim 1, further comprising a multipass amplifier configuration placed around the Ti:sapphire gain medium.

10. The system of claim 1 wherein the Ti:sapphire crystal is thinner than the confocal parameter of the pump beam, and further comprising optics configured to re-image the pump beam onto the crystal to absorb a significant fraction of the pump light.

11. The system of claim 1 wherein the Ti:sapphire crystal is substantially less than one absorption length thick and includes a back surface configured to reflect the pump beam and the seed light.

12. The system of claim 11, further including a heat extracting element attached to the Ti:sapphire crystal.

13. A Ti:sapphire amplification system comprising
   a seed source of light;
   a gain medium comprising a Ti:sapphire crystal; and
   a diode pump beam source comprising a diode laser for coupling a pump beam into the Ti:sapphire crystal; and
   a cooling device for cooling the Ti:sapphire crystal to below 200 K;
   wherein the pump beam is contained within a beam with a numerical aperture >0.2;
   wherein the crystal is configured to have a path length between 0.5-1.5 absorption lengths, crystal doping at or below 0.25% Ti by weight; and
   wherein the seed source is configured to provide a seed mode size 0.8-1.6 times the pump spot size in the Ti:sapphire crystal.

14. The system of claim 13 wherein the diode pump beam source includes multiple diodes coupled into a multimode fiber optic cable.

15. The system of claim 14 wherein the fiber optic cable has a numerical aperture below 0.22.

16. An amplification system comprising:
   a seed light source;
   a laser crystal gain medium comprising a Ti:sapphire crystal;
   a diode pump beam source; and
   a cooling device for cooling the Ti:sapphire crystal to below 200K;
   wherein the pump beam is focused to multiple regions in the laser crystal gain medium; and further comprising an apparatus for passing the seed light through the multiple regions in the laser crystal gain medium.

17. The amplification system of claim 16, wherein the seed light passing apparatus comprises a regenerative amplifier cavity.

18. The amplification system of claim 16, wherein the seed light passing apparatus comprises a multipass amplifier cavity.

* * * * *